United States Patent [19]
Hu

[11] Patent Number: 5,910,017
[45] Date of Patent: Jun. 8, 1999

[54] INCREASING UNIFORMITY IN A REFILL LAYER THICKNESS FOR A SEMICONDUCTOR DEVICE

[75] Inventor: Yin Hu, Plano, Tex.

[73] Assignee: Texas Instruments Incorporated, Dallas, Tex.

[21] Appl. No.: 08/804,452

[22] Filed: Feb. 21, 1997

[51] Int. Cl.⁶ ................................................. H01L 21/76
[52] U.S. Cl. ........................ 438/404; 438/405; 438/400
[58] Field of Search ..................................... 438/404, 405

[56] References Cited

U.S. PATENT DOCUMENTS 5,234,861  8/1993  Roisen et al. .
5,264,387  11/1993  Beyer et al. .

*Primary Examiner*—John F. Niebling
*Assistant Examiner*—Josetta I. Jones
*Attorney, Agent, or Firm*—Mark A. Valetti; Carlton H. Hoel; Richard L. Donaldson

[57] ABSTRACT

A technique of producing a semiconductor device or integrated circuit produces a planarized refill layer which has a more uniform thickness after etch back. In a silicon-on-insulator (SOI) device, dummy active areas are inserted between the active areas in order to maintain the thickness of the refill layer between the mesas to insure proper isolation between the active devices. The technique is also applicable to non-SOI devices.

8 Claims, 5 Drawing Sheets

INCREASING UNIFORMITY IN A REFILL LAYER THICKNESS FOR A SEMICONDUCTOR DEVICE

This application is related to copending application Ser. No. 08/804,484 filed on even date of this application (TI-20859), which is incorporated herein by reference.

BACKGROUND OF THE INVENTION

A known problem in semiconductor manufacturing is the lack of uniformity in the thickness of the layer of isolation material, that is grown or deposited between active areas of a semiconductor substrate, after etch back for planarizing the surface of the isolation material. The term "active area" is commonly used to describe that portion of the semiconductor substrate on which components are built, such as transistors, capacitors and resistors. As is well known in the art, in order to prevent crosstalk between active areas on a substrate, an electrical isolation material, commonly as a refill material, is placed between the active regions. In a silicon-on-insulator (SOI) device, one common method for making space for the refill material is to etch the silicon material above the buried insulator layer to form islands of active material commonly known as mesas, by methods well known in the art. This space is then filled (refilled) with the isolation material. Common refill materials include silicon dioxide and TEOS.

FIG. 1A shows a SOI semiconductor device 100 both before and after the etch back process. The device 100 is built upon a silicon substrate 102 having a buried insulator layer 104. The silicon material above the buried insulator material has already been etched away to form a mesa having a active area 106. Active layer 106 is covered by an isolation layer 108 which is typically a pad oxide of silicon dioxide. On top of pad oxide 108 is an isolation layer 110 which is typically silicon nitride. The resulting structure is then covered with refill layer 112 which may be silicon dioxide or TEOS, for example. As can clearly be seen by FIG. 1A, refill layer 112 does not have a flat topography and the thickness is significantly higher above active area 106.

As is well known in the art, it is desirable to have a flat or planarized surface for the refill layer 112 in order that subsequent layers of the semiconductor device be built on a flat surface. In order to achieve this planarized effect, one technique that is commonly used is to etch back the refill layer 112 until it reaches the isolation layer 110. Dashed lines 114, 116 and 118 represent the refill layer 112 after the etch back process. Line 114 represents the ideal case in which the refill material 112 it etched back until the material just reaches the silicon nitride layer 110. Notice that the resulting layer provides significant refill material on either side of the active area 106 but that this refill material tapers off rapidly as the distance from the side of the active area increases. Thus, in areas where there are no active areas, only a thin layer of refill material remains. In order to make sure that the etch back process has been completed, that is that no refill material remains on the silicon nitride layer, it is common to over-etch the refill material, as shown by dashed line 116. This leaves adequate refill material on the sides of the active area 106 but the material still tapers off away from the active areas in the same manner as shown by dashed line 114. In this case, however, because the material is etched to a greater degree, the etching process will etch away part of the buried insulator region 104 in areas away from active areas of the substrate. This occurs because the refill material is one form of silicon dioxide and the buried insulator layer is typically made of silicon dioxide, so that both oxides will be etched by the same etchant. Process parameters may vary from one operation to the next and dashed line 118 shows the result of the etch back process running too long. Sufficient refill material still remains on either side of active area 106 since the material is above the top of the active area. However, in regions away from the active area, the buried oxide 104 has been significantly etched thereby leaving little or no insulating layer in this region. This results in increased polycrystalline silicon layer to substrate capacitance and crosstalk between the polycrystalline silicon lines.

FIG. 1B shows a SEM photograph of an SOI mesa isolation process using TEOS as the refill material. In this photograph the device has a 0.3 micrometer line and a 0.9 micrometer spacing. As can be seen, the active area has only small refill areas on either side of the mesa that provides only sidewall insulation. The silicon nitride layer above the active areas and the refill areas is there in order to protect the devices on the substrate when they are cleaved for taking the photograph. Thus the silicon nitride layer will not be present in the device. Looking at the bottom of the silicon nitride layer, it can be seen that there is no refill material in the spaces between devices and that the buried insulator layer has been significantly etched away leaving little or no isolation material to prevent crosstalk between devices.

Accordingly, there is a need for a low-cost and effective method for reducing this non-uniformity in the refill layer.

SUMMARY OF THE INVENTION

It is a general object of the present invention to increase uniformity in the refill layer thickness after planarization.

It is a further object of the present invention to provide an increase uniformity in the refill layer thickness after etch back.

Yet another object of the present invention is to provide a silicon-on-insulator (SOI) semiconductor device having improved uniformity in the refill layer between mesas.

These and other objects, features and advantages are attained in accordance with one aspect of the present invention by a method for isolating an active area of a MOS semiconductor device. A first isolation layer is formed over a substrate. A first area of the substrate which will become an active area of the device and a second area of the substrate adjacent to but spaced from the active area which will become a dummy active area of the device are defined. A refill layer is deposited over the first isolation layer. The refill layer is etched back until the first isolation layer is exposed.

Another aspect of the invention includes a method of forming an isolation dielectric around a semiconductor island during a MOS semiconductor device manufacturing process in which an active area of the device is produced on the semiconductor island on a semiconductor substrate. A dummy active area is formed at a location adjacent to but spaced from the active area. A refill layer is formed covering the active area and the dummy active area. The refill layer is etched back.

A further aspect of the invention includes a MOS semiconductor device comprising a substrate, at least one active area on the substrate, and at least one dummy active area on the substrate adjacent to but spaced from the active area.

Yet another aspect of the invention comprises a silicon-on-insulator (SOI) MOS device. A silicon-on-insulator (SOI) substrate has a buried insulator layer. At least one active area being built on silicon above the buried insulator layer. At least one dummy active area being built on silicon above the buried insulator layer adjacent to but spaced from the active area.

DETAILED DESCRIPTION

Figure 1A:
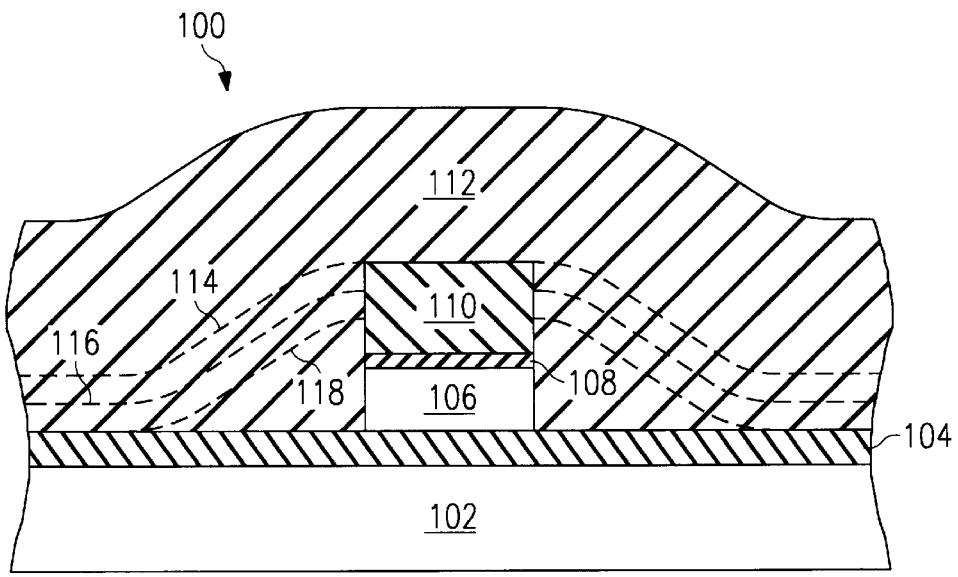
FIG. 1A is a cross sectional view of a prior art semiconductor device both before and after the etch back process.
Figure 2A:
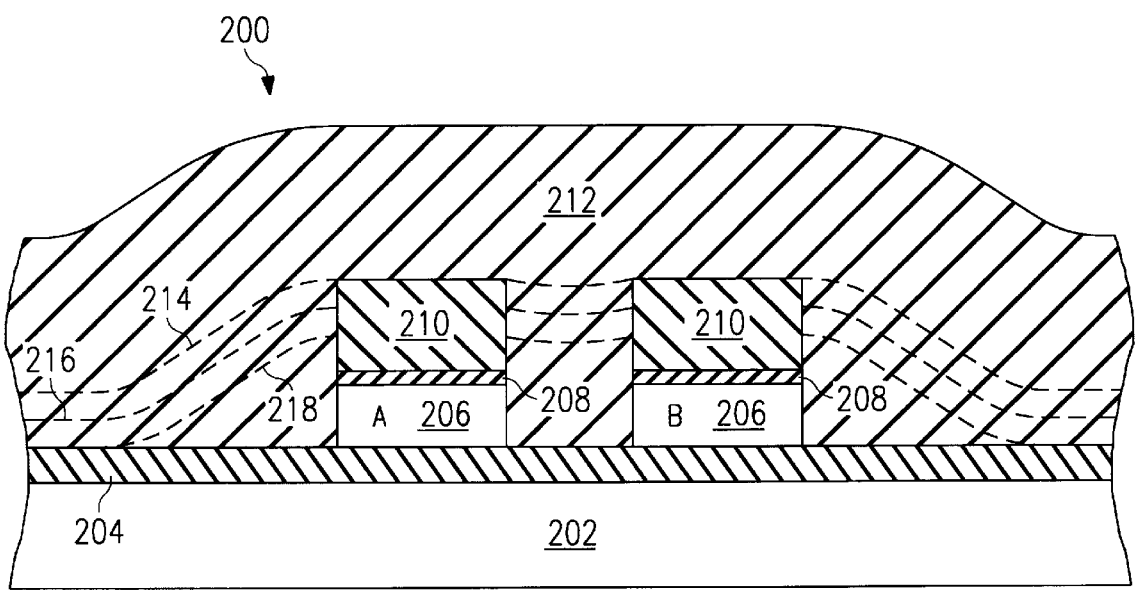
FIG. 2A is a cross sectional view similar to FIG. 1A except having two active areas adjacent one another.
Figure 1B:
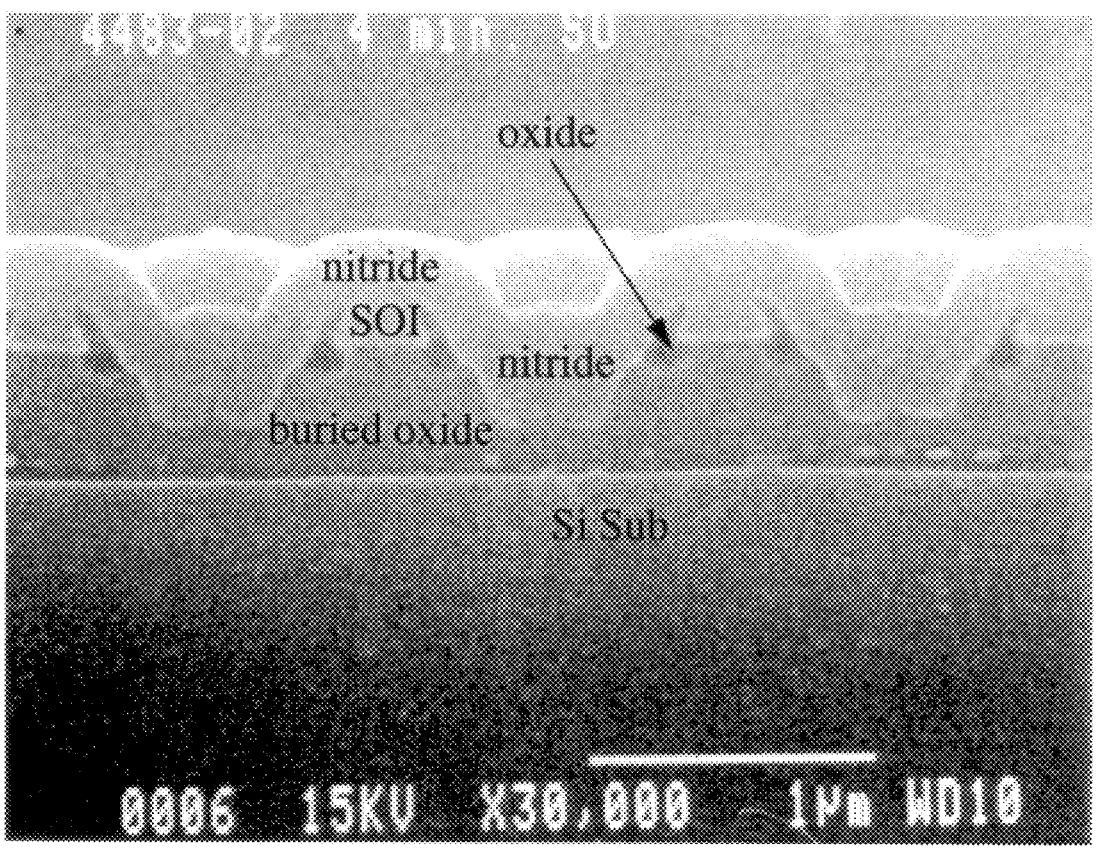
FIG. 1B is a SEM photograph a SOI device having mesa isolation with a TEOS sidewall process having a 0.03 micrometer line and a 0.9 micrometer spacing.

Applicants have discovered that the problem of the thinning of the refilled layer is greatly reduced in the presence of a second active area. FIG. 2A is similar to FIG. 1A with the exception that two active areas A and B are built adjacent to each other. In FIG. 2A, the substrate 202 has a buried oxide layer 204 formed thereon. The active silicon layer 206 has been patterned into two mesa structures A and B. Each mesa structure has an isolation layer or thermal pad of buffer oxide which may be 100 to 300 angstroms in thickness. On top of the pad buffer layer 208 is a second isolation layer 210 which may be of silicon nitride of 1,000 to 2,000 angstroms in thickness which may be formed by chemical vapor deposition (CVD) or other suitable process. The pad oxide serves as a buffer between the silicon substrate and the silicon nitride because of the high stress at a silicon nitride-silicon interface which will cause dislocations in the silicon, as is well known to those skilled in the art. If silicon nitride is not utilized for the layer 210, it may not be necessary to use a pad buffer layer 208. A refill layer 212 is formed over the resultant structure. The refill layer may be formed of silicon dioxide or TEOS, for example. As can be seen, the refill layer is non uniform in thickness, having a higher profile over the active areas than over the non-active areas. The refill layer 212 is etched back using conventional processes. The dashed lines 214, 216 and 218 correspond to the dashed lines 114, 116 and 118 shown in FIG. 1A. As in FIG. 1A, dashed line 214 represents an ideal etch back situation in which the refill layer is etched back until it just touches the silicon nitride isolation layer 210. Dashed line 216 represents the typical over etch utilized in this process. As is known in the art, it is common to over etch the refill layer to make sure there is no refill material on top of the silicon nitride as it is necessary to remove the silicon nitride in order to open the active areas for further processing. Dashed line 218 corresponds to a situation in which the refill material has been over etched by a greater degree, similar to dashed line in FIG. 1A. The areas to the left and right of the active areas A and B have a similar profile to the dashed lines 114, 116 and 118 to the right and left of the active area 106 in FIG. 1A. However, as can be seen by the dashed lines between mesas A and B, even the greater over etched situation shown in dashed line 218 still leaves sufficient insulating material between the mesas to provide proper isolation. Thus, in areas where the active areas are more closely spaced, the problem will not exist. This does not occur at all sections of the device and in any event would not project the active areas that are adjacent to field areas of the device.

Figure 2B:
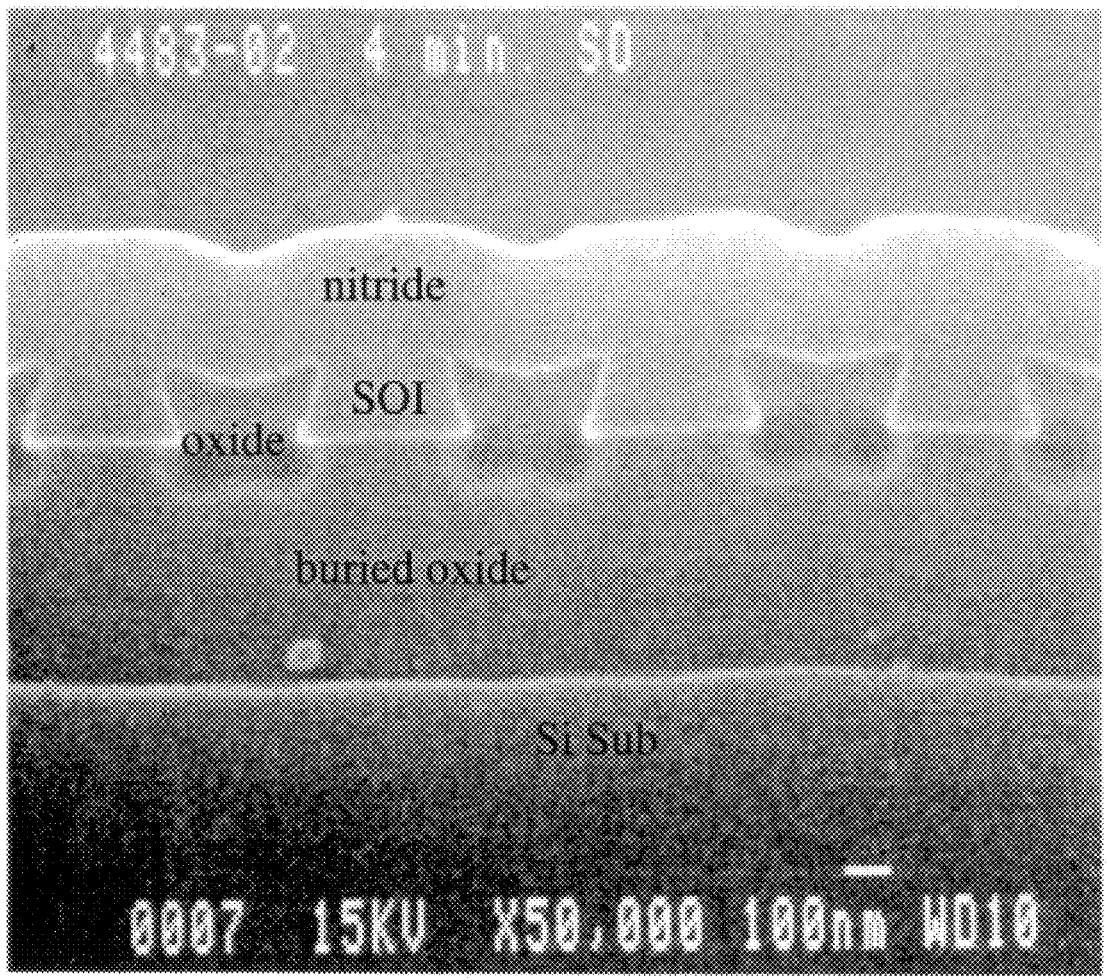
FIG. 2B is a SEM photograph of a SOI device having mesa isolation with a TEOS sidewall process and having 0.3 micrometer line and a 0.3 micrometer spacing.

FIG. 2B is similar to 1B except that the device utilizes a 0.3 micrometer line and 0.3 micrometer spacing. Again, there is a nitride layer on top of the active areas and refill areas of the device which is used to protect the devices during the cleave operation. As can be seen by the dark areas which are the refill material, the refill area is substantially flat on only a minor amount of open "dishing", thus providing adequate isolation between the silicon mesas. In this photograph, the refill material protrudes into the third insulator region because of a minor amount of over etching during the formation of the mesas on this device. This is not necessary to practice the present invention. In the photograph of FIG. 2B, some of the silicon mesas will be developed as active areas of the circuit, in accordance with the circuit design. The other areas will not be developed into active areas and will serve as "dummy" active areas solely for the purpose of eliminating this thinning problem in the refill layer thickness. The term "dummy active area" as used herein is an area of the substrate which is formed in the same manner as the active areas, which is later not developed into an active or passive device. These dummy active areas serve to protect the active areas from thinning of the refill layer around the active area and protect the buried insulator layer from being etched.

FIGS. 3A through 3F show the process steps that are necessary to implement the present invention. The process starts with FIG. 3A in which a device 300 being fabricated has a silicon substrate 302 having a buried insulator layer 304 and an active silicon layer 306. The active silicon area 306 has been covered with an isolation layer 308 which is a thermal pad or buffer oxide of 100 to 300 angstroms in thickness, for example. A silicon nitride layer 310 is formed on top of the pad oxide by chemical vapor deposition (CVD) or other suitable process through a thickness of 1,000 to 2,000 angstroms, for example. Although the process is illustrated as starting with a silicon-on-insulator (SOI) substrate, this process can also be utilized in a non-SOI processes.

Figure 3A:
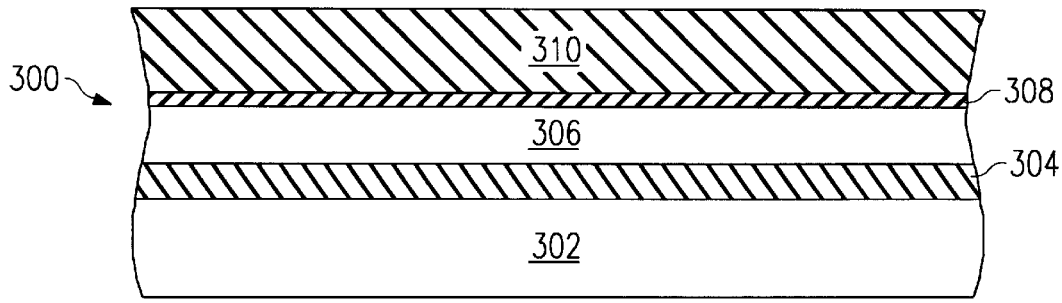
FIGS. 3A–3F show a cross sectional view of the steps necessary to fabricate a device in accordance with the present invention.
Figure 3B:
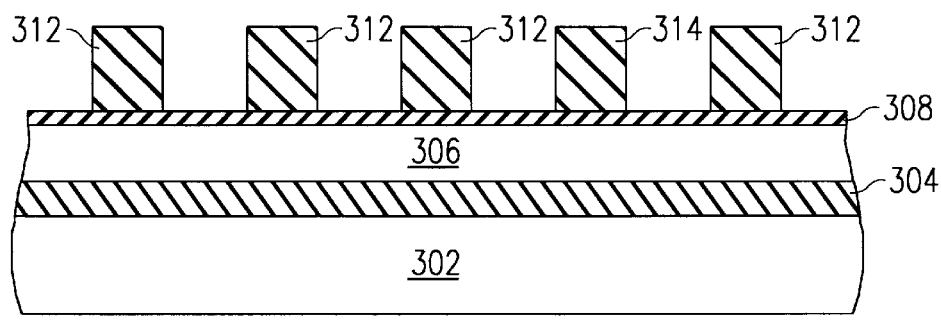

In FIG. 3B, the silicon nitride layer shown in FIG. 3A is patterned to define a silicon nitride layer 312 which will cover layers that will later become active areas of the device and a silicon nitride layer 314 which will become a dummy active area of the device.

Figure 3C:
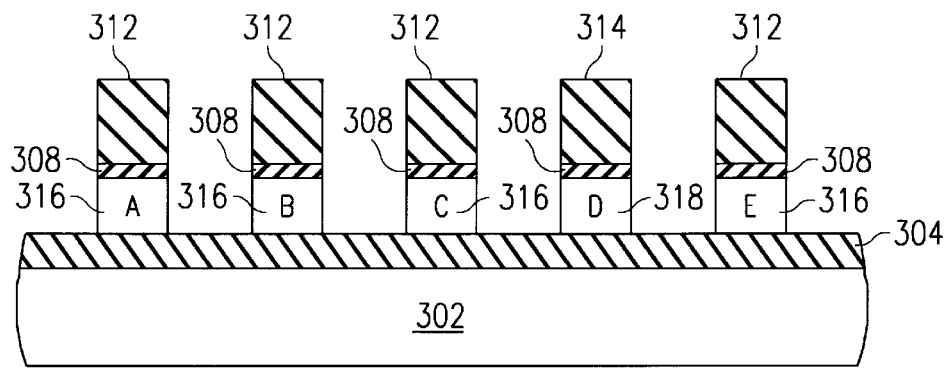

In FIG. 3C, the pad or buffer oxide layer 308 has been etched between the patterned silicon nitride areas 312 and 314 and the active silicon beneath these areas has been etched away to form mesa structures A–E. Mesa structures A,B,C and E contain areas of silicon 316 which will become active areas of the device whereas mesa structure D contains an area of silicon 318 which will become a dummy active area of the device. The formation of mesa structures in well known in the art and need not be described here in detail.

Figure 3D:
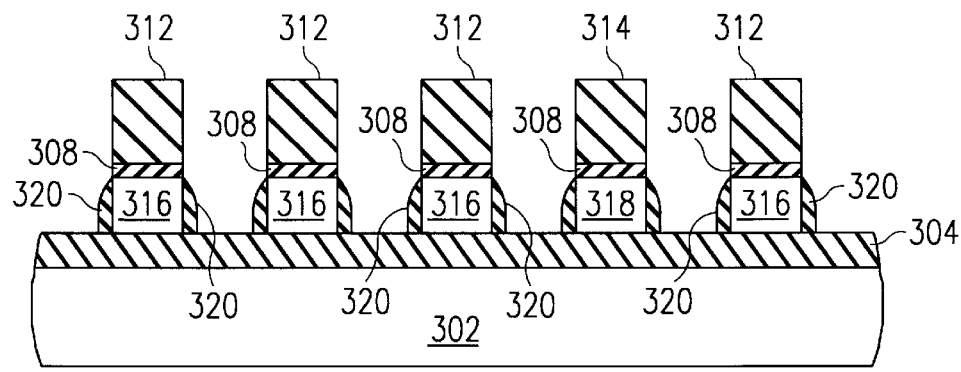

In FIG. 3D, sidewalls 320 are formed of silicon dioxide or silicon nitride, for example. Techniques for forming these sidewalls are well known in the art and need not be described in detail here. These sidewalls are optional to the implementation of the present invention, but provide better adhesion of the refill matrial to the active area and helps to suppress parasitic leakage to the device from the edge.

Figure 3E:
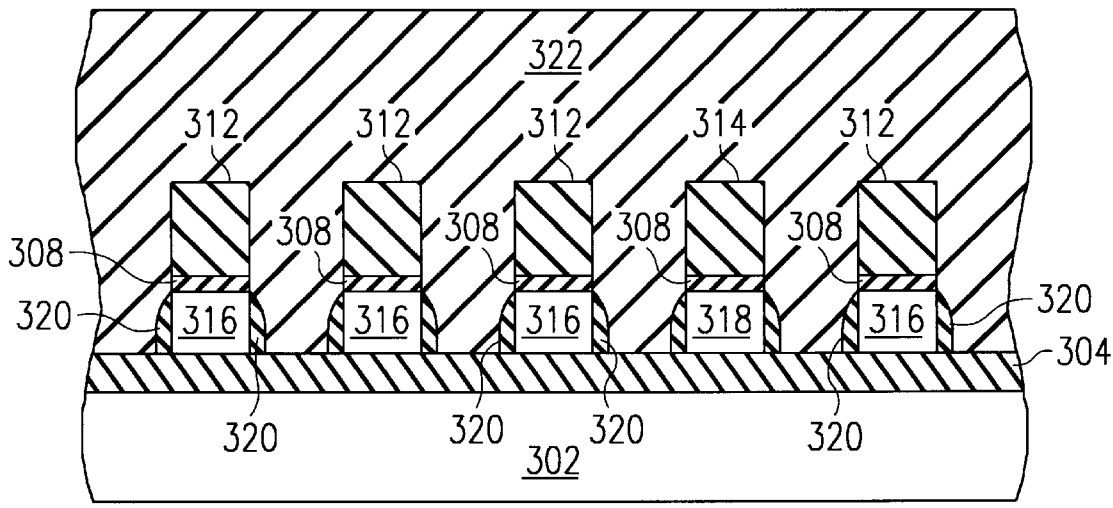

In FIG. 3E, a layer of refill material 322 such as TEOS, is grown over the resulting structure. Other refill materials such as silicon dioxide can also be utilized. The presence of multiple structures underneath the refill layer cause the layer to be deposited with a relatively flat depography, as shown in FIG. 3E.

Figure 3F:
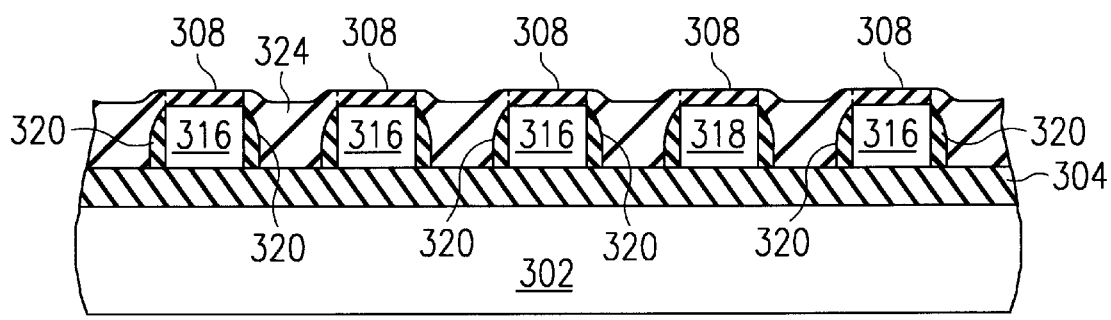

This structure is then planarized using an etch-back technique by subjecting the structure to a plasma etch, for example. The structure resulting from the etch-back process after the silicon nitride areas 312 and 314 have been removed by a hot phosphoric acid etch, for example, is shown in FIG. 3F. As can be seen in FIG. 3F, the planarized refill material 324 has a relatively flat topography between mesas with only a minor amount of "dishing". Thus, there is adequate insulating material between each of the mesas to prevent cross talk between the active devices. The buried insulating layer 304 is undamaged. Processing will continue from this point by opening the areas above the silicon areas 316 which will become active devices, and,active devices will be formed therein. These procedures vary according to the type of device that will be built in the active area and are well known in the art and thus not need not described in detail herein. It should be noted that the dummy active areas could be developed into unconnected active areas if desired. These devices could be biased to minimize capacitance to the polycrystalline silicon layers. In addition various patterns can be used for implantation into the dummy active areas, such as to include or exclude well implants, channel implants, etc. A pattern within a dummy active area could be to connect the dummy active area to the well potential or isolate it from the well or to create a pattern to reduce cross coupling through the dummy active area.

Figure 3G:
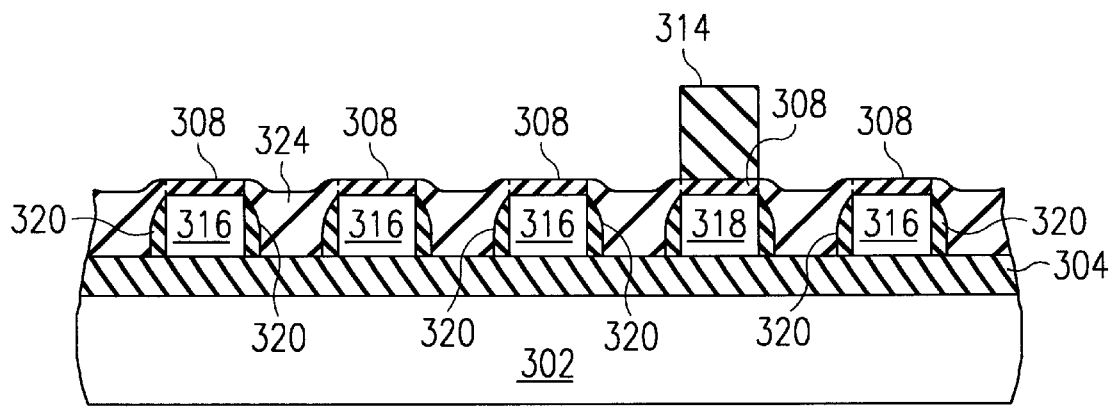
FIG. 3G is an alternate embodiment of the steps shown in FIG. 3F.

FIG. 3G shows an alternate to the structure shown in FIG. 3F. In FIG. 3G, the silicon nitride layer 314 is patterned so that it is not removed during the hot phosphoric acid etch. It thus remains during the further processing of the active areas to protect the dummy acted area 318 and can later be removed, if desired.

While a particular embodiment of the present invention has been disclosed herein, certain changes and modifications will readily occur to those skilled in the art. For example, although the present invention as being implemented on an SOI device, the invention is equally applicable to non-SOI devices. Furthermore, while the invention is shown utilizing TEOS as the refill material, any other suitable material may be used. In addition, although the refill layer is shown as being deposited herein, the present invention will also work with a grown refill material such as silicon dioxide. Also changes and modifications can be made without departing from the invention as defined by the appended claims.

What is claimed is:

1. A method for isolating an active area of a MOS semiconductor device on a silicon-on-insulator substrate having a first silicon region, a first insulator layer over said first silicon region, and a second silicon region over said first insulator layer comprising:

forming a second isolation layer with an upper surface over said second silicon region;

etching said second isolation layer, and said second silicon region, to form at least one mesa of active area and at least one mesa of dummy active area;

depositing a refill layer with an upper surface over said first isolation layer and said second isolation layer; and etching back said refill layer until said upper surface of said second isolation layer is exposed.

2. The method of claim 1 further comprising: forming a third isolation layer that is above said second silicon region and below said second isolation layer.

3. The method of claim 1, wherein said upper surface of said refill layer is above said upper surface of said second isolation layer.

4. A method for isolating an active area of a MOS semiconductor device comprising:

forming a first isolation layer over a substrate;

defining a first area of said substrate which will become an active area of the device and a second area of said substrate adjacent to but spaced from said active area which will become a dummy active area of the device, wherein dummy active area is in the form of an at least partial ring structure;

depositing a refill layer over said first isolation layer;

etching back said refill layer until said first isolation layer is exposed.

5. A method for isolating an active area of a MOS semiconductor device comprising:

forming a first isolation layer over a substrate;

defining a first area of said substrate which will become an active area of the device and a second area of said substrate adjacent to but spaced from said active area which will become a dummy active area of the device;

depositing a refill layer over said first isolation layer;

etching back said refill layer until said first isolation layer is exposed;

patterning said first isolation layer above said dummy active area; and removing said first isolation layer from said active area but not from said dummy active area.

6. In a MOS semiconductor device manufacturing process in which an active area of the device is produced on a semiconductor island on a silicon-on-insulator (SOI) substrate, a method of forming an isolation dielectric around said island comprising the steps of:

forming a dummy active area at a location adjacent to but spaced from said active area;

removing silicon substrate above a buried insulator region of said silicon-on-insulator substrate except in said active area and said dummy active area to form a mesa of active area and a mesa of dummy active area;

forming a refill layer covering said active area and said dummy active area; and etching back said refill layer.

7. In a MOS semiconductor device manufacturing process in which an active area of the device is produced on a semiconductor island on a semiconductor substrate, a method of forming an isolation dielectric around said island comprising the steps of:

forming a dummy active area at a location adjacent to but spaced from said active area, wherein said dummy active area is in the form of an at least partial ring structure;

forming a refill layer covering said active area and said dummy active area; and etching back said refill layer.

8. In a MOS semiconductor device manufacturing process in which an active area of the device is produced on a semiconductor island on a semiconductor substrate, a method of forming an isolation dielectric around said island comprising the steps of:

forming a dummy active area at a location adjacent to but spaced from said active area;

forming a refill layer covering said active area and said dummy active area;

etching back said refill layer;

patterning the isolation layer above said dummy active area; and removing said isolation layer from said active area but not from said dummy active area.

* * * * *

UNITED STATES PATENT AND TRADEMARK OFFICE
CERTIFICATE OF CORRECTION

PATENT NO. : 5,910,017  
DATED : June 8, 1999  
INVENTOR(S) : Yin Hu

Page 1 of 1

It is certified that error appears in the above-identified patent and that said Letters Patent is hereby corrected as shown below:

Title page,
Item [62], Related U.S. Application Data, add -- Provisional Application No. 60/011,989, Feb. 21, 1996. --

Column 1,
Line 1, add -- This application claims priority under 35 USC 119(e)(1) of provisional application number 60/011,989, filed 2/21/96. --

Signed and Sealed this

Twenty-eighth Day of June, 2005

JON W. DUDAS
*Director of the United States Patent and Trademark Office*